United States Patent
Balk et al.

(10) Patent No.: US 9,204,566 B2
(45) Date of Patent: Dec. 1, 2015

(54) COMPOSITE MATERIAL FADEC BOX SUPPORT

(71) Applicant: SAFRAN, Paris (FR)

(72) Inventors: Wouter Balk, Melun (FR); Robin Mandel, Paris (FR)

(73) Assignee: SAFRAN, Paris (FR)

( * ) Notice: Subject to any disclaimer, the term of this patent is extended or adjusted under 35 U.S.C. 154(b) by 331 days.

(21) Appl. No.: 13/851,458

(22) Filed: Mar. 27, 2013

(65) Prior Publication Data

US 2013/0258583 A1 Oct. 3, 2013

(30) Foreign Application Priority Data

Mar. 28, 2012 (FR) .................................. 12 52785

(51) Int. Cl.
*H05K 7/20* (2006.01)
*H05K 5/03* (2006.01)
*H05K 5/00* (2006.01)
*H05K 5/02* (2006.01)
(Continued)

(52) U.S. Cl.
CPC .. *H05K 5/03* (2013.01); *G06K 1/20* (2013.01); *H05K 5/0073* (2013.01); *H05K 5/0213* (2013.01); *H05K 5/0234* (2013.01); *H05K 7/20127* (2013.01)

(58) Field of Classification Search
CPC ........... G06F 1/181–1/182; G06F 1/20; H05K 9/0001–9/9006; H05K 7/20218–7/20381; H05K 7/20409–7/20418; H05K 7/20009–7/202; H05K 5/03; H05K 5/0213–5/0234; H05K 5/0073; H05K 7/20127; H01L 23/367–23/3677; H01L 23/473; H01L 23/46–23/467

USPC ........................ 361/676–678, 679.46–679.54, 361/688–723; 165/80.1–80.5, 104.33, 185; 174/15.1–15.3, 16.1–16.3, 547, 548; 454/185; 257/712–722, E23.088; 24/453, 458–459; 312/236

See application file for complete search history.

(56) References Cited

U.S. PATENT DOCUMENTS

| | | | |
|---|---|---|---|
| 5,031,396 A | 7/1991 | Margnelli | |
| 6,365,244 B1 * | 4/2002 | Ren et al. | 428/35.7 |
| 6,548,753 B1 * | 4/2003 | Blackmon et al. | 174/50 |

(Continued)

FOREIGN PATENT DOCUMENTS

| EP | 0 694 120 | 1/1996 |
|---|---|---|
| EP | 2 244 543 A2 | 10/2010 |

(Continued)

OTHER PUBLICATIONS

French Preliminary Search Report issued Dec. 6, 2012, in French 1252785, filed Mar. 28, 2012 (with English Translation of Categories of Cited Documents).

(Continued)

*Primary Examiner* — Anthony Haughton
*Assistant Examiner* — Razmeen Gafur
(74) *Attorney, Agent, or Firm* — Oblon, McClelland, Maier & Neustadt, L.L.P.

(57) ABSTRACT

A device for protecting a computer of an aircraft turbine engine, the device comprising a box containing the computer and a cover covering the box, the box being supported by tabs forming integral portions of the box and maintaining a flow of air between the bottom of the box and a portion of the casing of the engine on which they are to come into secure contact via resilient studs, the box being made of a composite material.

15 Claims, 1 Drawing Sheet

(51) Int. Cl.
*G06K 1/20* (2006.01)
*H01L 23/473* (2006.01)

(56) References Cited

U.S. PATENT DOCUMENTS

| | | | |
|---|---|---|---|
| 6,771,501 B2 * | 8/2004 | Coleman et al. | 361/700 |
| 6,864,422 B1 * | 3/2005 | Dionne et al. | 174/51 |
| 7,779,811 B1 * | 8/2010 | Mailander et al. | 123/399 |
| 2004/0206818 A1 * | 10/2004 | Loda et al. | 235/424 |
| 2004/0238687 A1 * | 12/2004 | Jones et al. | 244/62 |
| 2004/0257778 A1 * | 12/2004 | Lee | 361/752 |
| 2005/0017876 A1 * | 1/2005 | Ziarno | 340/945 |
| 2005/0056447 A1 * | 3/2005 | Nakamura et al. | 174/58 |
| 2005/0252194 A1 * | 11/2005 | Orlando et al. | 60/226.1 |
| 2009/0175718 A1 * | 7/2009 | Diaz et al. | 415/180 |
| 2010/0163174 A1 * | 7/2010 | Calder et al. | 156/285 |
| 2010/0241331 A1 * | 9/2010 | Duke et al. | 701/100 |
| 2010/0242492 A1 * | 9/2010 | Sloat et al. | 60/793 |
| 2010/0253188 A1 * | 10/2010 | Koyama | 312/223.1 |
| 2010/0263900 A1 | 10/2010 | Divincenzo et al. | |
| 2011/0002782 A1 * | 1/2011 | Boucher et al. | 415/213.1 |
| 2011/0023447 A1 * | 2/2011 | Veilleux | 60/39.83 |
| 2011/0085307 A1 * | 4/2011 | Burgi et al. | 361/752 |
| 2011/0120081 A1 * | 5/2011 | Schwark et al. | 60/226.3 |
| 2011/0271655 A1 * | 11/2011 | Poisson | 60/39.83 |
| 2011/0310574 A1 * | 12/2011 | Nomoto | 361/752 |
| 2012/0120596 A1 * | 5/2012 | Bechtolsheim | 361/679.48 |
| 2012/0305172 A1 * | 12/2012 | Maheshwari et al. | 156/182 |
| 2013/0319016 A1 * | 12/2013 | Fontanel et al. | 62/3.61 |

FOREIGN PATENT DOCUMENTS

| | | |
|---|---|---|
| EP | 2 607 651 A2 | 6/2013 |
| GB | 1 069 247 | 5/1967 |
| WO | WO 93/06343 | 4/1993 |
| WO | WO 94/20739 | 9/1994 |

OTHER PUBLICATIONS

Search Report issued Aug. 1, 2013 in United Kingdom Patent Application No. GB1305595.9.

* cited by examiner

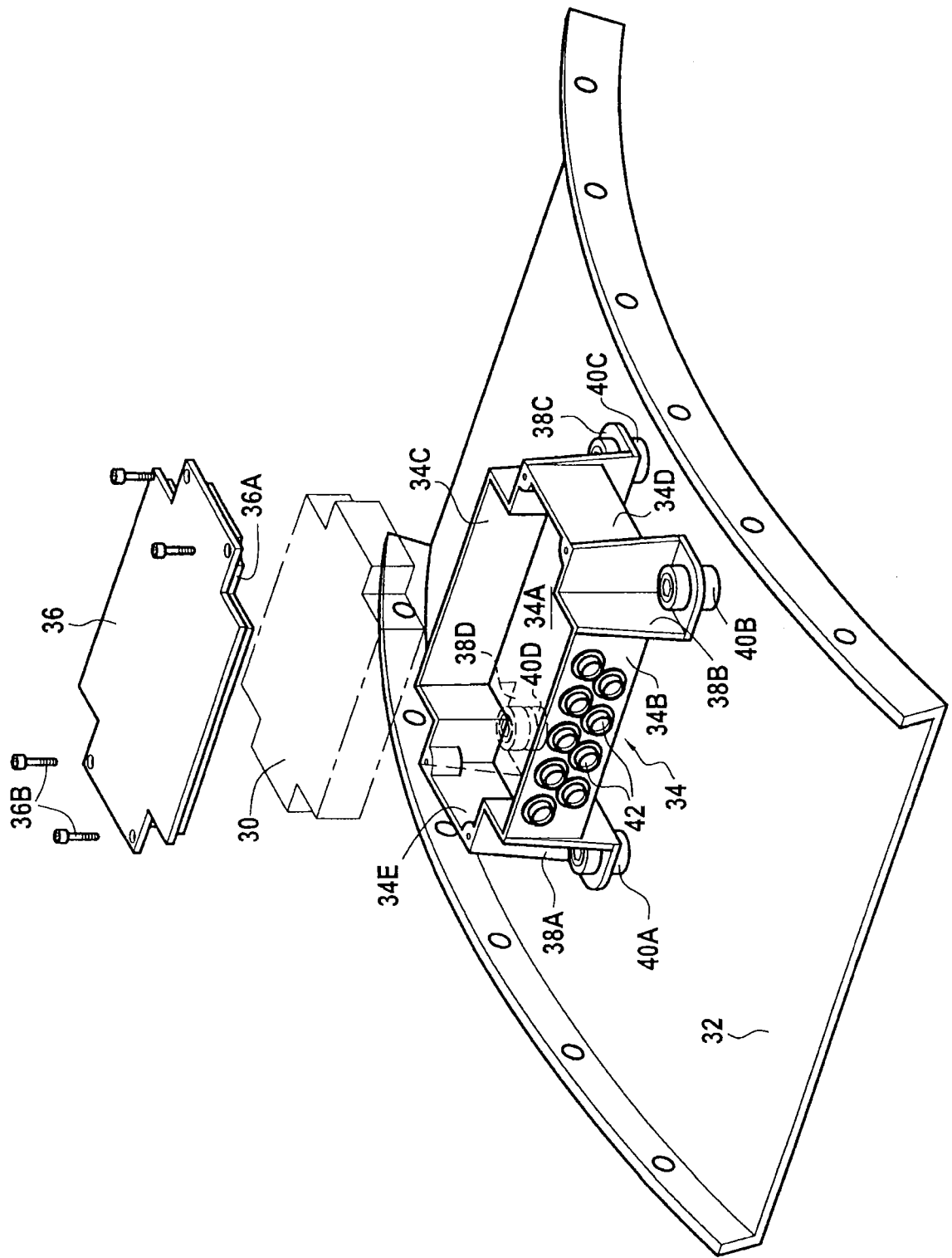

COMPOSITE MATERIAL FADEC BOX SUPPORT

BACKGROUND OF THE INVENTION

The present invention relates to the general field of aviation turbine engines, and in particular turbojets. More particularly, it relates to a device for protecting the full authority digital engine control (FADEC) and that is capable under all circumstances of ensuring that the FADEC is maintained on a portion of the casing of the engine.

In most aeroengines presently in service, the FADEC is fastened to the fan casing, and thus in a zone that is particularly sensitive to fire. Specifically, installing the FADEC in a non-fire zone (i.e. a zone in which it is not possible for flammable liquids to meet a source of ignition) that is spaced apart from the engine compartment by firewalls, or indeed installing the FADEC in the fuselage of the airplane, would lead to severe constraints in terms of installation, and to impacts on weight and to extra cost as a result of the additional connections and difficulties of maintenance.

The FADEC is conventionally fastened by supports/fittings made of mechanically welded stainless steel sheets that must therefore withstand fire while also protecting the electronic components of the computer from the vibration that might be generated by a potential unbalance on the rotors of the engine and that must be capable of withstanding accelerations up to 150 g. Another object of such supports is to preserve minimum spacing between the casing and the bottom of the FADEC housing, said spacing being of the order of a few tens of millimeters (typically 40 mm), firstly so as to ensure that air can flow between the casing and the FADEC, since the electronic components of a computer generate heat that needs to be removed by convection and radiation, and secondly to avoid physical contact between the casing and the FADEC in the event of a blade being lost. If there is an impact of a blade against the casing, the casing may be subjected to a large amount of deformation.

Those constraints that bear on the connection via supports are therefore not without drawbacks. Firstly the resulting structure is particularly heavy, which is most unwelcome in the field of aviation in which any reduction in on-board weight is welcome, and secondly that structure requires a large number of distinct components in order to be implemented, thereby involving industrial management that is burdensome and expensive.

OBJECT AND SUMMARY OF THE INVENTION

An object of the present invention is to mitigate those drawbacks by proposing to place the computer in a box that forms its own support and that can be connected directly to the casing of the engine. The invention thus seeks to provide a solution to the problem posed by the connection between the computer and the casing that is simple, inexpensive, and effective.

The invention thus provides a device for protecting a computer of an aircraft turbine engine, the device comprising a box containing said computer and a cover covering said box, said main box being supported by tabs forming integral portions of said box and maintaining a flow of air between the bottom of said box and a portion of the casing of said engine on which they are to be secured via resilient studs, said box being made of a composite material.

Thus, by eliminating the supports, with their function now being provided by the tabs of the box, the number of components in the structure surrounding the computer is limited, and by making that box out of a composite material, its weight is considerably reduced.

Depending on the intended embodiment, said box may made of a discontinuous long fiber composite material obtained by thermo-compression, said composite material is then preferably formed of a polymer matrix of epoxy resin, phenolic resin, or PEEK, and discontinuous long fibers of carbon, glass, or aramid, or else said box may be made of a short fiber composite material obtained by injection molding, said composite material then preferably being formed of a polymer matrix of epoxy resin, phenolic resin, or PEEK, and of short fiber reinforcement of carbon, glass, or aramid.

Preferably, said box is substantially in the form of a rectangular parallelepiped and that it includes, in addition to said bottom, two longitudinal walls and two side walls defining four corners from which four tabs extend. At least one of said walls includes a plurality of connectors for making electrical connections with external connectors.

In order to satisfy the requirements associated with electrical conductivity and removing heat by radiation, said box is preferably made of a composite material that conducts heat, and depending on the looked-for level of protection, it may also be covered in a layer of metal so as to satisfy the requirements associated with protection against electromagnetic radiation, it also being possible for said layer of metal of said box to be covered in an intumescent paint in order to reinforce protection against fire.

Said computer is preferably a full authority digital engine control (FADEC).

The invention also provides a fan casing having the above-specified protection device fastened thereto, and a turbine engine, such as a turbojet, incorporating such a fan casing.

BRIEF DESCRIPTION OF THE DRAWING

Other characteristics and advantages of the present invention appear from the following description made with reference to the sole FIGURE, which shows an embodiment having no limiting character.

DETAILED DESCRIPTION OF THE INVENTION

The way the FADEC 30 is fastened on a portion of the casing 32 of an aircraft turbine engine in accordance with the invention is shown in the sole FIGURE, which shows a device for protecting a computer, which device comprises a box 34 for containing the computer 30 and a cover 36 covering the box. The box is supported by tabs 38A-38D forming integral portions of the box and secured via resilient studs 40A-40D to the engine casing. The tabs serve to maintain a flow of air between the bottom 34A of the box and the portion of the engine casing on which it is secured. The studs are typically made of elastomer, they isolate the computer 30 from engine vibration, and they are directly in contact with the casing of the turbine engine.

In the example shown, the box 34 is substantially in the form of a rectangular parallelepiped and, in addition to the bottom 34A, it includes two longitudinal side walls 34B, 34C, and two side walls 34D, 34E defining four corners from which the tabs of the box extend. On one of the longitudinal walls of the box there are connectors 42 for connecting with connectors that are not shown (these connectors being used for example to communicate with the actuators and the sensors that are present on the engine). On its periphery, the cover 36 preferably possesses an engagement surface that fits exactly in the box 34 when the cover is closed by screw type fastener means 36B, thereby ensuring that the box is perfectly sealed.

The box is made of a composite material having discontinuous long fibers (DLF) and obtained in conventional manner by thermo-compression in a mold (making it possible to guarantee high levels of shape stability and of rigidity), the mold comprising male and female portions. More particularly, this composite material is preferably formed of a polymer matrix of epoxy resin or PEEK, and of discontinuous long fiber reinforcement of carbon, of glass, or of aramid. Nevertheless, it is also possible to envisage obtaining this box by injection molding a thermoplastic or a thermosetting matrix with short fibers (<10 mm) of carbon, glass, or aramid.

The composite material that must provide good conduction of heat in order to satisfy the requirements associated with the FADEC (electrical conductivity, removing heat by radiation, for example) may preferably also be coated in a layer of metal in order to provide better protection against electromagnetic radiation. It is also possible to provide additional protection against fire, such as intumescent paint. Naturally, the composite material and its protections also apply likewise to the cover 36.

This serves to obtain firstly a saving in weight because the traditional metal housing of the computer is replaced by a housing made of composite material, and because the supports and their fastener bolts are omitted, and secondly a saving in cost because of the reduction in the number of different parts that are required, since the supports are incorporated in the computer housing and assembly is simplified.

It should be observed that although reference is made above to a box that is in the form of a rectangular parallelepiped, it should nevertheless be understood that any other shape could also be envisaged, this shape being intended above all to allow sufficient draft to make it possible for the box to be molded in tooling constituted by a male mold and a female mold.

Similarly, although it is preferable for the matrix of the composite material to be made out of epoxy resin or PEEK (polyether ether ketone), it must be understood that it is also possible to envisage using a thermoplastic matrix other than PEEK or a thermosetting matrix other than epoxy resin (an example being a phenolic resin).

Finally, although the protection device shown is for housing a full authority digital engine control (FADEC) and for connecting it to a fan casing, it is clear that the invention is also applicable to other computers on board a turbine engine, such as the thrust reverser control unit or the ignition computer, for example.

What is claimed is:

1. A device for protecting a computer of an aircraft turbine engine, the device comprising:
   a box made of a composite material to contain said computer, said box being supported by tabs forming integral portions of said box and extending from a bottom of said box to maintain a flow of air between said bottom and a portion of a casing of said engine, the tabs come into secure contact with the casing via resilient studs, and
   a cover to cover said box and including on a periphery of the cover an engagement surface configured to exactly fit said box.

2. A device according to claim 1, wherein said box is made of a discontinuous long fiber composite material obtained by thermo-compression.

3. A device according to claim 2, wherein said composite material is formed of a polymer matrix of epoxy resin, phenolic resin, or PEEK, and discontinuous long fibers of carbon, glass, or aramid.

4. A device according to claim 1, wherein said box is made of a short fiber composite material obtained by injection molding.

5. A device according to claim 4, wherein said composite material is formed of a polymer matrix of epoxy resin, phenolic resin, or PEEK, and of short fiber reinforcement of carbon, glass, or aramid.

6. A device according to claim 1, wherein said box is substantially in the form of a rectangular parallelepiped and the box includes, in addition to said bottom, two longitudinal walls and two side walls defining four corners from which four tabs extend.

7. A device according to claim 6, wherein at least one of said walls includes a plurality of connectors to make electrical connections with external connectors.

8. A device according to claim 1, wherein said box is made of a composite material that conducts heat in order to provide electrical conductivity or to remove heat by radiation.

9. A device according to claim 1, wherein said box is covered in a layer of metal in order to satisfy requirements associated with protection against electromagnetic radiation, with electrical conductivity, or with removing heat by radiation.

10. A device according to claim 9, wherein said metal layer of said box is covered in intumescent paint in order to reinforce protection against fire.

11. A device according to claim 1, wherein said computer is a full authority digital engine control (FADEC).

12. A fan casing including a FADEC protection device according to claim 11.

13. A turbine engine including a fan casing according to claim 12.

14. A device according to claim 1, wherein the box includes longitudinal walls and side walls, the tabs each include two tab surfaces meeting at a corner edge of the box, and each of the two tab surfaces extends toward an inside of the box with respect to a respective wall among the longitudinal walls and the side walls that is directly connected to each of the two tab surfaces.

15. A device according to claim 1, wherein the tabs each include two tab surfaces meeting at a corner edge of the box and a third tab surface substantially parallel to the cover, and the third tab surface is secured to a respective one of the resilient studs.

* * * * *